United States Patent [19]

Nguyen

[11] Patent Number: 4,928,261
[45] Date of Patent: May 22, 1990

[54] CMOS READ-ONLY MEMORY WITH STATIC OPERATION

[75] Inventor: Chinh Nguyen, Vimercate, Italy

[73] Assignee: SGS-Thomson Microelectronics SRL, Italy

[21] Appl. No.: 245,655

[22] Filed: Sep. 16, 1988

[30] Foreign Application Priority Data

Oct. 20, 1987 [IT] Italy ................ 22339 A/87

[51] Int. Cl.⁵ ............................................. G11C 7/00
[52] U.S. Cl. .................................. 365/104; 365/190; 365/189.11; 307/279
[58] Field of Search ............ 365/104, 190, 181, 227, 365/182, 189.11; 307/279

[56] References Cited

U.S. PATENT DOCUMENTS

| | | | |
|---|---|---|---|
| 4,165,538 | 8/1979 | Kitamura | 365/104 X |
| 4,389,705 | 6/1983 | Sheppard | 365/104 X |
| 4,695,979 | 9/1987 | Tuvell et al. | 365/104 |
| 4,811,301 | 3/1989 | Houston | 365/104 |
| 4,823,319 | 4/1989 | Pfennings | 365/189 X |

FOREIGN PATENT DOCUMENTS 63-108596  5/1988  Japan .................................. 365/104

Primary Examiner—James W. Moffitt
Assistant Examiner—Alfonso Garcia
Attorney, Agent, or Firm—Wolf, Greenfield & Sacks

[57] ABSTRACT

A CMOS read-only memory with static operation having at least one individually activatable row ($R_n$) and a plurality of main columns ($C_1$, $C_2$) which cross the rows, each crossing including pull-down cell ($N_1$) corresponding to a logical "0" or a pull-down cell ($N_2$) corresponding to a logical "1", the pull down cells controlled the individually activatable row, the main columns leading to the supply voltage through a respective pull-up transistor ($P_1$, $P_2$). To each main column, there is an associated auxiliary column ($CX_1$, $CX_2$) which is also connected to the supply voltage through a respective pull-up transistor ($PX_1$, $PX_2$). The gates of the pull-up transistors of the main columns are connected to a respective auxiliary column, and the gates of the pull-up transistors of the auxiliary columns are connected to a respective main column.

4 Claims, 1 Drawing Sheet

CMOS READ-ONLY MEMORY WITH STATIC OPERATION

BACKGROUND OF THE INVENTION

1. Field of the Invention

The present invention relates to an electronic solid-state read-only memory (ROM), particularly of the CMOS type, with static operation, i.e. with no need for a timing clock.

2. Prior Art

As is known, static read-only memories in CMOS technology are essentially constituted by a certain number of metallic and polycrystalline-silicon paths arranged in the form of crossing rows and columns, the columns being connected to respective pull-up elements, which in practice are transistors which always conduct between the columns and a supply voltage, and the rows leading to a address driven decoder circuit raises a single row to a high voltage. In each crossing, the rows and the columns can be insulated or the column can be connected to the drain of a transistor (a pull-down transistor) having its source connected to the ground and its gate driven by the row. Therefore, when a given row is raised to a high voltage by the decoder, the columns which it crosses are brought to a ground voltage if the pull-down element is present, while they remain at high voltage if they are insulated. Therefore the presence of the pull-down transistor corresponds to a logical "1", while its absence corresponds to a "0".

The same structure as ROM memory is found in programmable logic arrays, or PLAs, which are distinguished by true ROM memories by the fact that in this case not all the possible combinations of input to the decoder are decoded. For the purposes of the invention, the term "read-only memory" will be used to refer both to ROM memories and to programmable logic arrays.

During the read of a given address of a ROM memory of this type, both the pull-up and the pull-down cells are activated, and a static current thus flows from the supply voltage towards ground. The read speed is therefore limited, and the current consumption is high, since each cell drains current from the supply voltage.

In order to overcome the disadvantages of low speed and high consumption of static ROM memories, it is already known to provide dynamic ROM memories, in which the steps $0_1$ and $0_2$ of the clock are used to alternately activate the pull-up cells and the pull-down cells, so as to never have static current. The charge stored during the first step provides the current for the operation of the pull-down cells on the columns. However, if the memory is operated at low speed (i.e. if the clock frequency is low), it is necessary to provide a latch at the output to statically store the status of the columns during the second step, since the dispersion current can discharge the parasite capacitor of the column.

Dynamic memory is faster than static memory and has a lower consumption, but it has the disadvantage that it requires the two clock steps $0_1$ and $0_2$, linked to the synchronism of the system, and that it furthermore requires a latch at its output.

SUMMARY OF THE INVENTION

The aim of a present invention is therefore to provide a ROM memory (or a PLA) which has the low consumption of dynamic memory and requires neither clocks nor output latches.

This aim, together with other objects and advantages as will become apparent from the following description, is achieved by the invention with a read-only memory in CMOS technology, comprising a plurality of individually activatable rows and a plurality of main columns crossing the rows and connected, at each crossing corresponding to a logical "0", to a pull-down cell controlled by the crossed line, each main column leading to the supply voltage through a respective pull-up transistor characterized in that an auxiliary column is associated with each main column and is also connected to the supply voltage through a respective pull-up transistor, and is connected, at each crossing corresponding to a logical "1", to a pull-down cell controlled by the crossed line, and in that the gates of the pull-up transistors of the main columns are connected to the auxiliary columns, and the gates of the pull-up transistors of the auxiliary columns are connected to the main columns.

BRIEF DESCRIPTION OF THE DRAWINGS

A preferred embodiment of the invention is now described, given by way of non-limitative example with reference to the accompanying drawings, wherein.

DETAILED DESCRIPTION OF THE PREFERRED EMBODIMENTS

Figure 1:
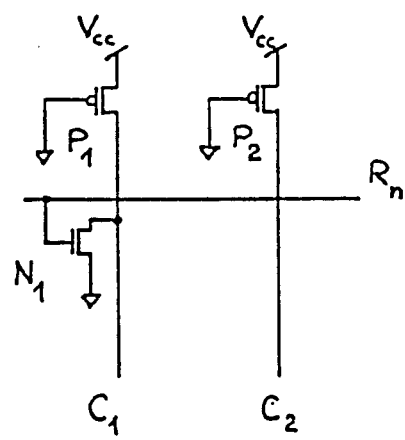
FIG. 1 is a partial circuit diagram of a CMOS read-only memory of the static type according to the prior art.

In FIG. 1, two columns $C_1$ and $C_2$ of a ROM memory in CMOS technology, of the static type, cross a generic row $R_n$. The complete memory comprises respective pluralities of rows and columns, which are not illustrated for the sake of simplicity.

Each column leads to the drain of a respective PMOS transistor $P_1$ and $P_2$, each having its source connected to the positive supply voltage $V_{cc}$ and its gate connected to the ground. Therefore $P_1$ and $P_2$, as mentioned in the introduction, act as pull-up cells which keep the columns $C_1$ and $C_2$ high. The row $R_n$ is driven by the output of a decoder DEC, which raises it when a preset address is applied to its input in a per se known manner. At the crossing between row $R_n$ and column $C_1$ an NMOS transistor $N_1$ has its drain connected to column $C_1$, its drain connected to ground and its gate connected to row $R_n$. No cell is connected at the crossing between row $R_n$ and column $C_2$. Therefore, when row $R_n$ is active, column $C_1$ is forced to ground, providing a logical "0", while column $C_2$ remains high, to provide a logical "1". In this manner the entire memory is programmed.

As mentioned, this type of memory absorbs a static current from $V_{cc}$, with high power consumption and low operating speed.

Figure 2:
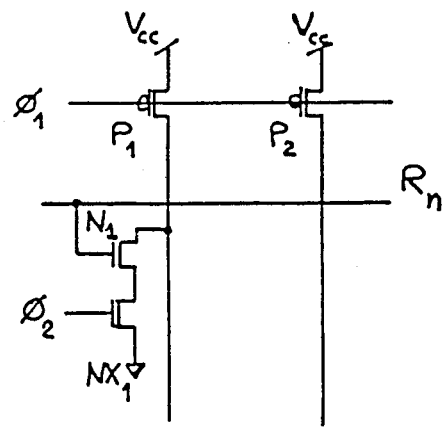
FIG. 2 is a partial circuit diagram of a CMOS read-only memory of the dynamic type according to the prior art.

FIG. 2 is similar to FIG. 1, but refers to a ROM memory of the dynamic type, again according to the prior art. The transistors $P_1$ and $P_2$ are activated by a signal $O_1$, linked to the clock of the system, while the ROM cell $N_1$ is connected to ground through a further NMOS transistor $NX_1$, controlled by a signal $O_2$ in opposite phase with respect to $O_1$. In this manner, as mentioned, the columns $C_1$ and $C_2$ are raised only when they are insulated from ground, and are thus precharged, while the read of the row $R_n$ occurs when the columns are insulated from $V_{cc}$, using the stored charge. Therefore there is no static current, power consumption is low and operating speed is high. The ROM of FIG. 2 requires, however, the two clock signals $O_1$ and $O_2$, and furthermore, it is usually necessary to provide a latch at the output of the columns for a safe readout despite the dispersion of the charge from the columns.

Figure 3:
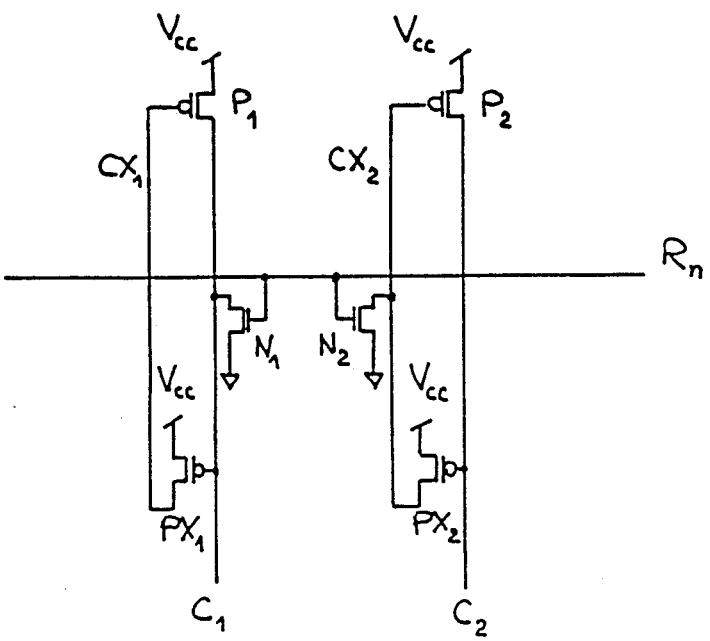
FIG. 3 is a partial circuit diagram of a CMOS read-only memory of the static type according to the invention.

FIG. 3 is similar to FIGS. 1 and 2, but relates to a ROM memory in CMOS technology according to the invention. This execution again comprises rows $R_n$ and columns $C_1$ and $nC_2$, each leading to a pull-up transistor $P_1$ $_l$ $_{and}$ $_{P2}$. A second auxiliary column $CX_1$ and $CX_2$ is arranged to the side of each column and is connected on one side to the gates of transistors $P_1$ and $P_2$ and on the other side to $V_{cc}$ through respective PMOS transistors $PX_1$ and $PX_2$, the gates whereof are respectively connected to columns $C_1$ and $C_2$.

The crossings between the (generic) row $R_n$ and the respective pairs of columns $C_1$-$CX_{11}$ $_{and}$ $_{c2}$-$CX_2$ i.e. the individual cells, all have a respective NMOS pull-down transistor $N_1$ and $N_2$, with the gates driven by the row $R_n$ and drains connected to the ground. The drains of transistor $N_1$ and of transistor $N_2$ are respectively connected to the main column $C_1$ to generate a logical "0", and to the auxiliary column $CX_2$ to generate logical "1".

The memory operates as explained hereafter. When the row $R_n$ is activated, all the NMOS transistors are activated. Column $C_1$ reaches ground voltage, thus activating the pull-up transistor $PX_1$ and raising column $CX_1$ to $V_{cc}$. The transistor $P_1$ is thus switched "off", and the output of the column $C_1$ is statically low, since its pull-down transistor $N_1$ is activated.

At the same time column $CX_2$ is also brought to ground voltage, and thus activates the pull-up transistor $P_2$ of the column $C_2$, which switches "off" transistor $PX_2$. The column $C_2$ thus remains statically high by virtue of $P_2$.

The circuit absorbs current only during switching, i.e. while the row passes from active to inactive, or vice versa, when the NMOS pull-down cells create a path towards ground from the pull-up transistors which are active at that moment. Once the main and auxiliary columns C and CX have reached their final state, there is no longer any static current, since a single PMS or NMOS transistor is active for each column, but never both. Since each column is connected either to $V_{cc}$ or to ground through an active transistor, there is no problem of dispersion.

Consumption is practically nil, similarly to the consumption of dynamic memory, with the advantage of eliminating the clock and the latch. The added auxiliary column is a negligible burden in comparison to said advantages.

The operating speed and the simplicity of the design are similar to those of static memory. Furthermore, the programming of the memory depends only on a metallic connection from the drain of the pull-down cell to one or the other of the two columns, main and auxiliary. Reprogramming is therefore easier than in the conventional solution, since it involves a simple metallic contact and not an active semiconductor area.

A preferred embodiment of the invention has been described, but it is understood that it is susceptible to equivalent modifications and variations on the part of the expert in the field, according to the given teachings, without thereby abandoning the scope of the inventive concept.

I claim:

1. A CMOS read-only memory comprising in combination,
   at least one individually activatable row and a plurality of main columns crossing said row and defining a plurality of cross-points, each said column of said plurality of main columns being connected to a supply voltage through a respective first pull-up transistor;
   a first pull-down cell placed at a first cross-point of said plurality of cross-points and controlled by said at least one row;
   a second pull-down cell placed at a second cross-point of said plurality of cross-points and controlled by said at least one row; and
   a plurality of auxiliary columns, each auxiliary column associated with a respective main column and connected to the supply voltage through a respective second pull-up transistor, the respective gate of each said second pull-up transistor, the respective gate of each said second pull-up transistor being connected to a respective main column and the respective gate of each said first pull-up transistor being connected to a respective auxiliary column.

2. CMOS read-only memory according to claim 1, wherein said supply voltage is positive, each said first pull-up transistor and each said second pull-up transistor being of the PMOS type.

3. CMOS read-only memory according to claim 2, wherein each said pull-up cell comprises a transistor of the NMOS type.

4. A CMOS read-only memory according to claim 1 wherein said first pull-down cell is a logical "0" type cell and said second pull-down cell is a logical "1" type cell.

* * * * *